US012598943B2

(12) United States Patent　(10) Patent No.: US 12,598,943 B2
Oosterlaken et al.　(45) Date of Patent: Apr. 7, 2026

(54) WAFER BOAT SYSTEM, HOLDER RING AND USE THEREOF

(71) Applicant: ASM IP Holding B.V., Almere (NL)

(72) Inventors: Theodorus G.M. Oosterlaken, Oudewater (NL); Anne Geertruid Maria Spruit, Utrecht (NL); Marina de Jager, Dronten (NL); Bram van den Brink, Bussum (NL); Angelos Karagiannis, Leuven (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/755,610

(22) Filed: Jun. 26, 2024

(65) Prior Publication Data

US 2025/0006529 A1　Jan. 2, 2025

(30) Foreign Application Priority Data

Jun. 28, 2023　(GR) ............................... 20230100522

(51) Int. Cl.
H01L 21/673　(2006.01)
H01L 21/67　(2006.01)
H01L 21/687　(2006.01)

(52) U.S. Cl.
CPC .. H01L 21/67309 (2013.01); H01L 21/67017 (2013.01); H01L 21/67259 (2013.01); H01L 21/68721 (2013.01)

(58) Field of Classification Search
CPC ........... H01L 21/6773; H01L 21/67303; H01L 21/67309; H01L 21/3732; H01L 21/67017; H01L 21/67259; H01L 21/68721

USPC ...... 211/41.18; 206/454, 832, 710; 414/935, 414/938
See application file for complete search history.

(56) References Cited

U.S. PATENT DOCUMENTS

| | | | | | |
|---|---|---|---|---|---|
| 5,219,079 A | * | 6/1993 | Nakamura | ........ | H01L 21/67309 |
| | | | | | 211/41.18 |
| 5,310,339 A | * | 5/1994 | Ushikawa | ......... | H01L 21/67115 |
| | | | | | 432/259 |
| 5,577,621 A | * | 11/1996 | Yi | ...................... | H01L 21/67309 |
| | | | | | 211/41.18 |
| 5,752,609 A | * | 5/1998 | Kato | ................. | H01L 21/67309 |
| | | | | | 211/41.18 |
| 5,788,088 A | * | 8/1998 | Kao | ................... | G11B 33/0405 |

(Continued)

FOREIGN PATENT DOCUMENTS

| | | | | | |
|---|---|---|---|---|---|
| EP | 4498411 A2 | * | 1/2025 | ......... | C23C 16/4583 |

*Primary Examiner* — Jennifer E. Novosad
(74) *Attorney, Agent, or Firm* — Banner & Witcoff, Ltd.

(57)　ABSTRACT

A wafer boat system comprises a carrier and a plurality of holder rings configured to support a wafer in the carrier. Each of the holder rings has an annular body and ring projections projecting from said annular body for contact with the wafer. At the ring projections, a local surface area of the annular body is small compared to a circumferential average or median of the local surface area of the annular body, in particular so as to at least partly compensate for a surface area of the respective ring projection, thereby promoting evenness of vapor deposition on wafers supported on the holder rings in the carrier. The reduced local surface area is preferably realized by a relatively large inner radius of the annular body at the ring projection. The carrier may provide a reference structure for automated wafer positioning.

16 Claims, 9 Drawing Sheets

(56)             References Cited

U.S. PATENT DOCUMENTS

| | | | | | |
|---|---|---|---|---|---|
| 5,897,311 | A | * | 4/1999 | Nishi | H01L 21/67309 |
| | | | | | 432/239 |
| 6,062,853 | A | * | 5/2000 | Shimazu | H01L 21/6875 |
| | | | | | 211/41.18 |
| 6,093,644 | A | * | 7/2000 | Inaba | H01L 21/67306 |
| | | | | | 206/832 |
| 6,099,302 | A | * | 8/2000 | Hong | C30B 31/14 |
| | | | | | 211/41.18 |
| 6,099,645 | A | * | 8/2000 | Easley | C30B 31/14 |
| | | | | | 118/728 |
| 6,287,112 | B1 | * | 9/2001 | Van Voorst Vader | |
| | | | | | C30B 31/14 |
| | | | | | 211/41.18 |
| 6,378,538 | B1 | * | 4/2002 | Brandenburg | H01L 21/6708 |
| | | | | | 211/41.18 |
| 6,607,381 | B2 | * | 8/2003 | Minami | C30B 31/14 |
| | | | | | 211/41.18 |
| 6,716,027 | B2 | * | 4/2004 | Kim | H01L 21/67303 |
| | | | | | 118/728 |
| 6,796,439 | B2 | * | 9/2004 | Araki | H01L 21/67303 |
| | | | | | 211/41.18 |
| 7,033,126 | B2 | | 4/2006 | Van Den Berg | |
| 7,033,168 | B1 | * | 4/2006 | Gupta | C23C 16/4583 |
| | | | | | 211/41.18 |
| D551,634 | S | * | 9/2007 | Sugawara | D13/182 |
| 7,325,692 | B2 | * | 2/2008 | Nanjo | H01L 21/67309 |
| | | | | | 211/41.18 |
| 7,334,691 | B2 | * | 2/2008 | Liu | H01L 21/6734 |
| | | | | | 211/41.18 |
| D570,309 | S | * | 6/2008 | Sato | D13/182 |
| 7,484,958 | B2 | * | 2/2009 | Kobayashi | H01L 21/67309 |
| | | | | | 211/41.18 |
| 7,665,367 | B2 | * | 2/2010 | Mishiro | H01L 21/67303 |
| | | | | | 73/856 |
| 7,713,355 | B2 | * | 5/2010 | Zehavi | H01L 21/67303 |
| | | | | | 118/728 |
| 7,736,436 | B2 | * | 6/2010 | Cadwell | C30B 31/14 |
| | | | | | 414/935 |
| 7,963,735 | B2 | * | 6/2011 | Jang | H01L 21/67306 |
| | | | | | 414/804 |
| 8,042,697 | B2 | * | 10/2011 | Gilmore | H01L 21/67309 |
| | | | | | 211/41.18 |
| 8,220,647 | B2 | * | 7/2012 | Gilmore | H01L 21/67309 |
| | | | | | 211/41.18 |
| D791,721 | S | * | 7/2017 | Kusakabe | D13/182 |
| 10,008,402 | B1 | * | 6/2018 | Ogitsu | H01L 21/68735 |
| 10,072,892 | B2 | * | 9/2018 | Liu | H01L 21/67109 |
| D839,219 | S | * | 1/2019 | Yoshida | D13/182 |
| 11,367,641 | B2 | * | 6/2022 | Wu | H01L 21/67386 |
| 2003/0183614 | A1 | * | 10/2003 | Yamaguchi | C30B 31/10 |
| | | | | | 219/390 |
| 2004/0124413 | A1 | * | 7/2004 | Arai | H01L 21/68757 |
| | | | | | 211/41.18 |
| 2005/0145584 | A1 | * | 7/2005 | Buckley | H01L 21/67306 |
| | | | | | 211/41.18 |
| 2008/0000851 | A1 | * | 1/2008 | Pickering | H01L 21/67303 |
| | | | | | 211/41.18 |
| 2013/0213910 | A1 | * | 8/2013 | Kang | H01L 21/67303 |
| | | | | | 211/41.18 |
| 2015/0270150 | A1 | * | 9/2015 | Yoo | H01L 21/67309 |
| | | | | | 211/41.18 |
| 2019/0279887 | A1 | * | 9/2019 | Ma | H01L 21/67326 |
| 2022/0254668 | A1 | | 8/2022 | Oosterlaken | |
| 2025/0006529 | A1 | * | 1/2025 | Oosterlaken | H01L 21/68721 |

* cited by examiner

WAFER BOAT SYSTEM, HOLDER RING AND USE THEREOF

CROSS-REFERENCE TO RELATED APPLICATION(S)

This application claims the benefit of Greek patent application No. 20230100522 filed on Jun. 28, 2023, the entire contents of which are incorporated herein by reference.

FIELD

The invention relates to a wafer boat system, as well as to a holder ring for such a wafer boat system and to a use of the holder ring and/or the wafer boat system.

BACKGROUND

Wafer boats are known as such for use in processing semiconductor wafers in batches, for example for vapor deposition on the wafers. A wafer boat is typically a mainly cylindrical structure in which a number of circular wafers can be received axially spaced apart. The cylinder axis of the wafer boat may be oriented vertically so that the wafers extend mainly horizontally.

U.S. Pat. No. 6,287,112 B1 explains the general problem of possible non-uniformity across the wafer surface when a treatment gas is supplied radially. In particular, so-called edge effects may occur, e.g. resulting in increased material deposition at the edge of the wafer compared to at the center of the wafer. U.S. Pat. No. 6,287,112 B1 also discusses the possible use of rings to increase the uniformity. In some variations, the wafers may be supported on such rings, so that the rings may be regarded as holder rings.

Although past developments have contributed to increased uniformity of deposition across the wafer surface, further improvements are still desired. Meanwhile, it is desired for wafer processing to be efficient.

SUMMARY

With an aim to improving uniformity of deposition across wafer surfaces while maintaining or improving wafer processing efficiency, an aspect of the present invention provides a wafer boat system.

The wafer boat system comprises a carrier comprising a first end member at a first axial end of the carrier, a second end member at a second axial end of the carrier, and at least three mutually spaced apart axial rods each connecting the first end member with the second end member and each comprising a series of radially inwardly extending rod projections defining axially spaced apart holder ring positions.

The wafer boat system comprises a plurality of holder rings each engageable with the rod projections to position the holder ring in the carrier at one of the holder ring positions, wherein the holder ring when so engaged is configured to support a wafer in the carrier, at least when the axial rods are oriented vertically.

Each of the holder rings has an annular body and ring projections projecting from said annular body, the ring projections being arranged to be in contact with the wafer and to space the wafer apart from the annular body when the wafer is supported by the holder ring in the carrier.

Such ring projections are generally advantageous, in particular since they obviate the need for the wafers to be in direct contact with the carrier, which could otherwise contribute to non-uniformities. Meanwhile, by spacing the wafer apart from the annular body, the ring projections allow an end effector of a wafer positioning robot to reach under the supported wafer without interference from the annular body.

However, it has been found that such ring projections may themselves also contribute to some non-uniformities, wherein in particular deposition on the wafer may be locally reduced in an area adjacent to such a ring projection. The present invention is based on this insight, and is further based on the insight that such non-uniformities associated with the ring projections can advantageously be reduced by designing the annular body so as to at least partly compensate for the undesired deposition effect of the ring projections themselves, as detailed below.

Preferably, the annular body has a local surface area that varies along its circumferential direction, wherein, at the ring projections, the local surface area of the annular body is small compared to a circumferential average or median of the local surface area of the annular body, in particular so as to at least partly compensate for a surface area of the respective ring projection. Thereby, evenness of vapor deposition on wafers supported on the holder rings in the carrier may be promoted.

It has been found that such an at least partial compensation can advantageously result in a more uniform, i.e. more evenly distributed, vapor deposition on the wafer, in particular near the ring projections. Meanwhile, known advantages of the ring projections themselves can be maintained or improved. In particular, due to the ring projections spacing the supported wafer apart from the annular body, an end effector can still move between the annular body and the wafer.

It has also been found that the aforementioned compensation can be particularly effectively realized by a locally increased inner radius. Without wishing to be bound to theory, it is believed that this effect may be associated with the inner radius of the annular body generally being close to the edge of the wafer, in particular closer than the outer radius of the annular body.

In view thereof, preferably, the annular body has an inner radius that varies along its circumferential direction, wherein, at the ring projections, the inner radius is large compared to a circumferential average or median of the inner radius of the annular body.

The inner radius being large at the ring projections may result in a reduced local surface area, in particular in a manner that provides relatively effective compensation for the local deposition effect of the ring projections. At the ring projections, the inner radius being relatively large may thus contribute to the local surface area being relatively small as described.

Nevertheless, in some embodiments, some or all of the compensation, in particular the reduction in local surface area of the annular body, may be realized differently than by a locally increased inner radius of the annular body, for example by a locally decreased outer radius of the annular body and/or by one or more openings in the annular body between the inner and outer radii.

The local surface area may be defined based on a circumferential window of 30 degrees or smaller, preferably 20 degrees or smaller, more preferably 10 degrees or smaller, for example about 5 degrees, about 2 degrees or about 1 degree. In this way, a value for the local surface area can be determined for essentially any circumferential position, including circumferential positions of the ring projections. It shall be appreciated that determining such a value typically involves measuring and then adding up the surface areas of all surfaces of the section of the annular body that is within the circumferential window. By thus determining the value of the local surface area at regular circumferential intervals, an average or median value of the local surface area can be calculated for the entire annular body. Windows for adjacent intervals may or may not mutually overlap, as long as no gaps are present between the windows.

It shall be appreciated that the inner radius of the annular body may be determined for any circumferential position. However, it shall also be appreciated that any local enlargement of the inner radius will typically extend along a finite circumferential range or window. Therefore, a window based approach analogous to that described above may be applied with respect to the inner radius as well. Within such a window, the inner radius may still be variable, for example increasing towards a circumferential position of the ring projection, as explained elsewhere herein.

A further aspect provides a holder ring evidently configured for use as one of the holder rings of a wafer boat system as described herein, wherein the holder ring has an annular body and ring projections projecting from said annular body, the ring projections being arranged to be in contact with the wafer and to space the wafer apart from the annular body when the wafer is supported by the holder ring.

Such a holder ring can provide advantages corresponding to those described herein for the wafer boat system. The holder ring may for example be used as a replacement for a known holder ring to form a wafer boat system in combination with a known carrier.

The holder ring and/or the wafer boat system may advantageously be used for processing wafers, wherein during the processing the wafers are in contact with the ring projections of the holder ring that supports the respective wafer, preferably wherein the wafers are not in direct contact with the carrier. The processing may involve vapor deposition. In particular applications, a silicone-based compound is used in the vapor deposition.

Advantageous elaborations of the above described aspects and options are provided by the features of the dependent claims, as explained further in the below detailed description.

BRIEF DESCRIPTION OF THE DRAWINGS

In the following, the invention will be explained further with reference to examples of embodiments and drawings. The drawings are schematic and merely show examples. Descriptions of embodiments herein may also be understood independent from the drawings. In the drawings, corresponding elements have been provided with corresponding reference signs. For clarity of the drawings, elements may be indicated by reference signs only in one or some of the figures, and/or only for one or some of multiple instances of an element within a figure. In the drawings:

FIGS. 1 to 11 show parts of an example of a wafer boat system 1. FIGS. 12 to 14 show parts of a further example of a wafer boat system 1. Some geometric features of the ring projections 13 and adjacent sections of the annular body 12 differ between the two examples, as explained further elsewhere herein, whereas otherwise the two examples are similar. Further variations are possible, as will be apparent to the skilled person having the benefit of the present disclosure.

DETAILED DESCRIPTION

Figures 1, 2:
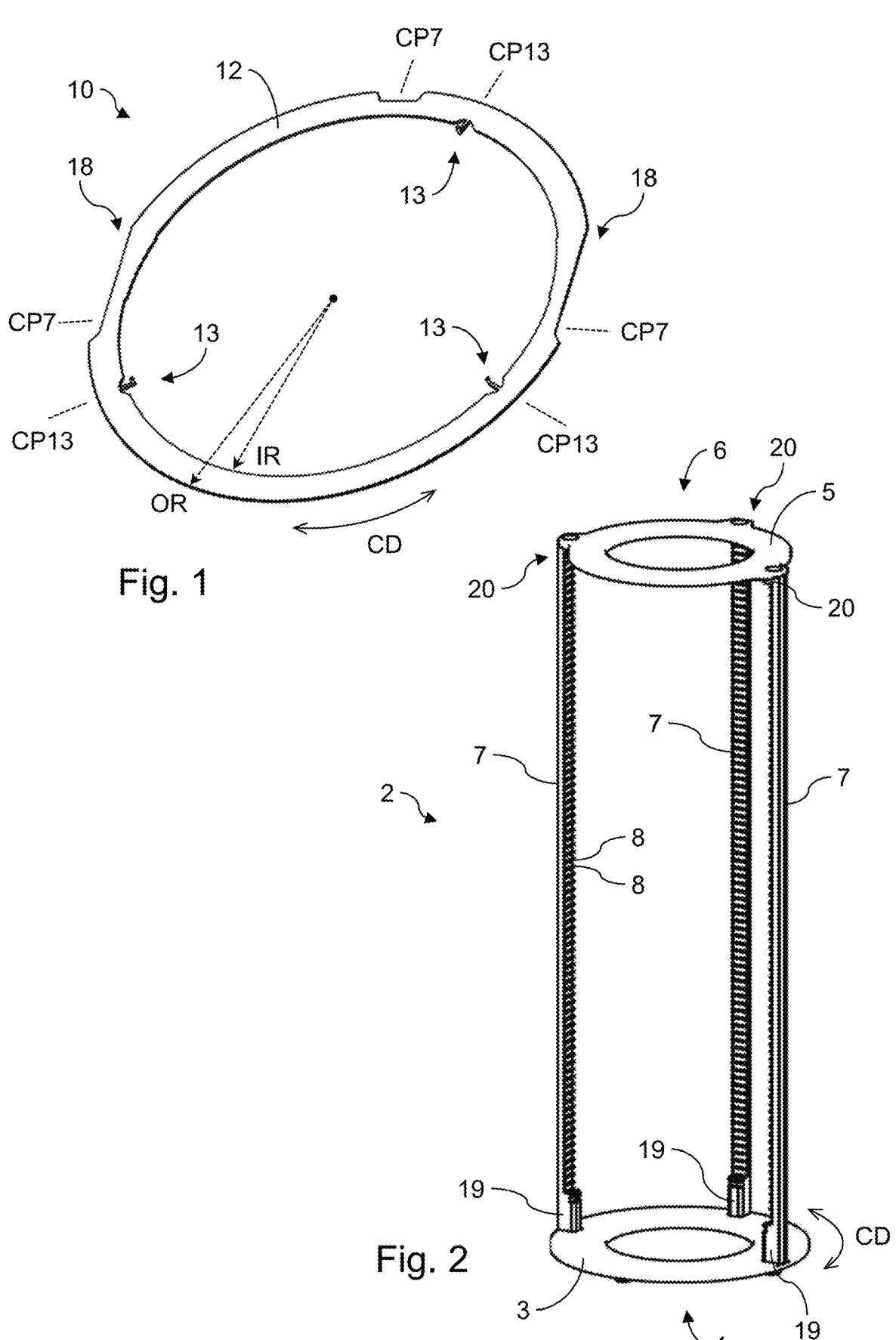
FIG. 1 shows a perspective view of a holder ring.
FIG. 2 shows a perspective view of a carrier.

The wafer boat system 1 comprises a carrier 2 comprising a first end member 3 at a first axial end 4 of the carrier 2, a second end member 5 at a second axial end 6 of the carrier 2, and at least three mutually spaced apart axial rods 7 each connecting the first end member 3 with the second end member 5 and each comprising a series of radially inwardly extending rod projections 8 defining axially spaced apart holder ring positions 9.

The wafer boat system 1 comprises a plurality of holder rings 10 each engageable with the rod projections 8 to position the holder ring 10 in the carrier 2 at one of the holder ring positions 9. When so engaged, the holder ring 10 is configured to support a wafer 11 in the carrier 2, at least when the axial rods 7 are oriented vertically.

Each of the holder rings 10 has an annular body 12 and ring projections 13 projecting from said annular body 12. The ring projections 13 are arranged to be in contact with the wafer 11 and to space the wafer 11 apart, in particular axially, from the annular body 12 when the wafer 11 is supported by the holder ring 10 in the carrier 2. As an example, a resulting axial distance between the annular body 12 and the wafer 11 may be about 4.5 mm.

Figure 14:
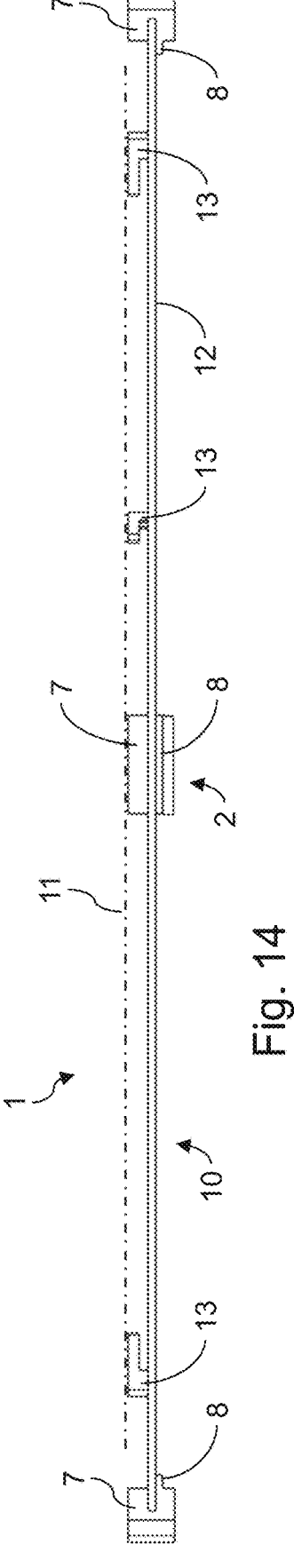
FIG. 14 shows a side view of the holder ring with carrier parts of FIG. 12, with a wafer.

As examples, FIGS. 3-4 and FIGS. 13-14 show how a wafer 11 may be supported by a holder ring 10, wherein an outline of the wafer 11 is indicated by a dash-dotted line. In FIG. 14, it can be seen how the holder ring 10 can meanwhile be supported by rod projections 8 of the axial rods 7 of the carrier 2. An arrangement as in FIG. 14 can be repeated along the axial direction of the carrier 2, resulting in a carrier 2 containing an axial series of holder rings 10 with a wafer 11 on each holder ring 10, the wafers 11 being axially spaced apart from the annular bodies 12 of the holder rings 10.

In embodiments, the annular body 12 is an annular disk like body 12, i.e. the annular body 12 is substantially shaped as an annular disk.

Thereby, the annular body 12 can be relatively flat and thin in axial direction, e.g. being plate like, while also helping to reduce edge effects during processing of the wafer 11. A relatively thin annular body 12 advantageously enables a relatively large number of wafers 11 to be supported in the carrier 2 while being spaced apart from the annular bodies 12. The annular body 12 can be made sufficiently strong and stiff to provide a robust intermediate support structure between the rod projections 8 and the wafer 11. As an example, an axial thickness of the annular body 12 may be about 1.75 mm.

Preferably, the annular body 12 has a local surface area that varies along its circumferential direction CD, wherein, at the ring projections 13, the local surface area of the annular body 12 is small compared to a circumferential average or median of the local surface area of the annular body 12, in particular so as to at least partly compensate for a surface area of the respective ring projection 13. Thereby, evenness of vapor deposition on wafers 11 supported on the holder rings 10 in the carrier 2 may be promoted.

Preferably, the annular body 12 has an inner radius IR that varies along its circumferential direction CD, wherein, at the ring projections 13, the inner radius IR is large compared to a circumferential average or median of the inner radius IR of the annular body 12, in particular to result in a reduced local surface area.

Figures 3, 4:
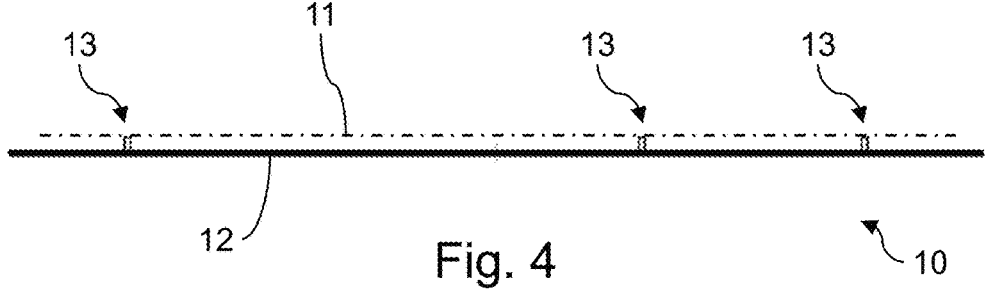
FIG. 3 shows a top view of the holder ring of FIG. 1, with a wafer.
FIG. 4 shows a side view of the holder ring of FIG. 1, with a wafer.

As an example, in FIG. 3 it can be seen that the inner radius IR has a same value along most but not all of the circumference of the ring 10. Specifically, the inner radius IR is here locally increased at the circumferential positions CP13 of the ring projections 13. Further, as explained elsewhere herein, the inner radius IR is here locally decreased at two sections 23. It shall be appreciated that the ring projections 13 themselves are not regarded as part of the annular body 12, even though they may be formed integrally therewith. In view thereof, the ring projections 13 themselves are ignored when measuring the inner radius IR of the annular body 12 at the ring projections 13.

At the ring projections 13, the inner radius IR being relatively large may contribute to the local surface area being relatively small.

In embodiments, the local surface area is defined based on a circumferential window CW of 30 degrees or smaller, preferably 20 degrees or smaller, more preferably 10 degrees or smaller. Meanwhile, the circumferential window CW may be at least 1 degree, for example 2 degrees or 5 degrees. Merely as an illustration of the concept of a circumferential window, one such a window CW has been indicated in FIG. 3 at one arbitrary circumferential position. It shall be appreciated that such circumferential window CW may be applied at regular intervals along the circumferential direction CD.

In embodiments, at the ring projections 13, the inner radius IR of the annular body 12 is at least 1% larger than the circumferential average or median of the inner radius IR of the annular body 12.

In this way, a particularly effective at least partial compensation can be realized with respect to the ring projection. In the example shown in FIG. 3, the inner radius IR of the annular body 12 is up to about 7% enlarged compared to a predominant value of the inner radius IR, which in this case corresponds to the circumferential average or median of the inner radius IR of the annular body 12.

In embodiments, along a circumferential section 14 of the annular body 12 adjacent the ring projection 13, the inner radius IR of the annular body 12 increases towards the circumferential position CP13 of the ring projection 13.

In this way, advantageously, the increase in inner radius IR can be relatively localized at the ring projection 13, without excessive local strength reduction of the annular body 12.

Figures 5, 6:
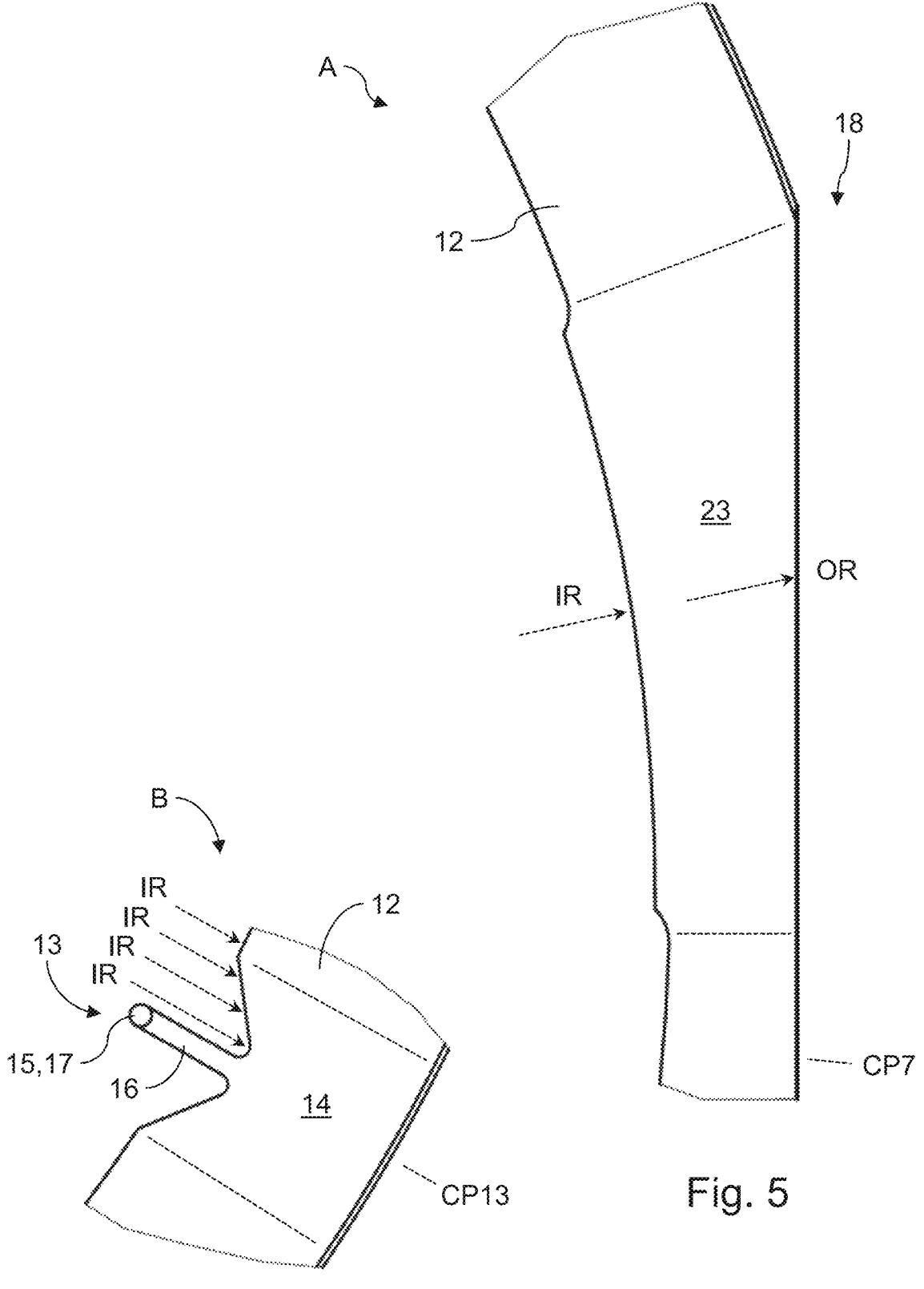
FIG. 5 shows a detail A from FIG. 3.
FIG. 6 shows a detail B from FIG. 3.

As an example, in FIG. 6 it can be seen that here the inner radius IR steadily increases towards the ring projection 13 in a section 14 adjacent the ring projection 13. Although a substantially linear or triangular increase is shown here, different types of increases are possible. For example, in the example of FIGS. 12-14 the increase is substantially parabolic, with the apex of the parabola arranged at the ring projection 13.

In embodiments, the increase in inner radius IR forms a distinct recess or notch at the circumferential section 14 adjacent the ring projection 13. The recess or notch may in particular be distinct by having edges, for example at circumferential borders of the section 14, where the rate of change of the inner radius along the circumferential direction CD may be discontinuous. Thereby, also, the increase in the inner radius IR can be relatively well localized at the respective ring projection 13. Nevertheless, in some alternative embodiments, the increase in the inner radius IR could form a smooth transition between the section 14 and a further section that is more remote from the ring projection 13.

In embodiments, the ring projections 13 extend from the annular body 12 radially inwardly beyond the local inner radius IR of the annular body 12.

Such a configuration enables the holder ring 10 to support the wafer 11 at positions radially inwardly from the inner radius IR of the annular body 12. Advantageously, the wafer 11 may thereby be supported somewhat inwardly from its outer edge, without the annular body 12 substantially overlapping with the wafer 11. Also, some tolerance for transversal positioning of the wafer 11 can thereby be provided if desired.

In embodiments, the ring projections 13 are connected to the annular body 12 at and/or adjacent the inner radius IR of the annular body 12.

A surface area of the ring projection 13 can thereby be kept relatively small, in particular while the annular body 12 extends radially outwardly beyond the edge of the wafer 11 to contribute to edge effect reduction and to form a robust support structure.

In embodiments, a distal end 15 of the ring projection 13 is radially inwardly and/or axially spaced apart from the annular body 12, the distal end 15 being arranged to be in contact with the wafer 11 when the wafer 11 is supported by the holder ring 10. Preferably, the distal end 15 is both radially inwardly and axially spaced apart from the annular body 12.

By the distal end 15 being axially spaced apart from the annular body 12, it can be promoted that the wafer 11 when supported is axially spaced apart from the annular body 12, an end effector to reach between the wafer 11 and the annular body 12 for automated positioning of the wafer 11. Advantages of the radially inwardly spacing apart of the distal end 15 from the annular body 12 correspond to those indicated above for the ring projections 13 extending radially inwardly beyond the local inner radius IR of the annular body 12.

In embodiments, a proximal section 16 of the ring projection 13 projects axially from the annular body 12, wherein a distal section 17 of the ring projection 13 extends radially inwardly from the proximal section 16 of the ring projection 13 at a distance from the annular body 12. An example of such a configuration can be seen in FIGS. 12-14.

In embodiments, a proximal section 16 of the ring projection 13 projects radially inwardly from the annular body 12, wherein a distal section 17 of the ring projection 13 extends axially from the proximal section 16 of the ring projection 13 at a distance from the annular body 12. An example of such a configuration can be seen in FIGS. 1, 3, 4, 6 and 7*a* and 7*b*.

It has been found that with the latter geometric configuration of the ring projection 13, the holder ring 10 can be produced more economically in some cases, although the former variant can be technically and economically feasible as well. Further variations are possible, for example wherein the ring projection 13 or at least a part thereof extends at a slanted angle, in particular as alternative to the shown relatively straight proximal and distal sections.

In embodiments, when the holder ring 10 is engaged with the rod projections 8 of the axial rods 7 of the carrier 2, the respective ring projections 13 are circumferentially spaced apart from the axial rods 7. This may apply in particular when the holder ring 10 is fully received in the carrier 2, so that each of the axial rods 7 is engaged with the holder ring 10, in particular at respective circumferential positions CW7, which may be predefined e.g. by variations in the outer radius OR of the annular body 12, as explained elsewhere herein.

Thereby, it can advantageously be prevented that localized processing effects of the axial rods 7 and the ring projections 13 would accumulate. See for example FIG. 12, where all three axial rods 7 can be seen to be circumferentially spaced apart from all three ring projections 13. Meanwhile, as shall be appreciated, both the axial rods 7 and the ring projections 13 are preferably substantially distributed along the circumferential direction CD, while the axial rods 7 are arranged to allow holder rings 10 and wafers 11 to be moved into and out of the carrier 2 in a transversal direction.

In embodiments, the annular body 12 has an outer radius OR that varies along its circumferential direction CD, wherein the variation of the outer radius OR determines respective rod positions CP7 for the axial rods 7 along the circumferential direction CD of the annular body 12.

Figure 7A:
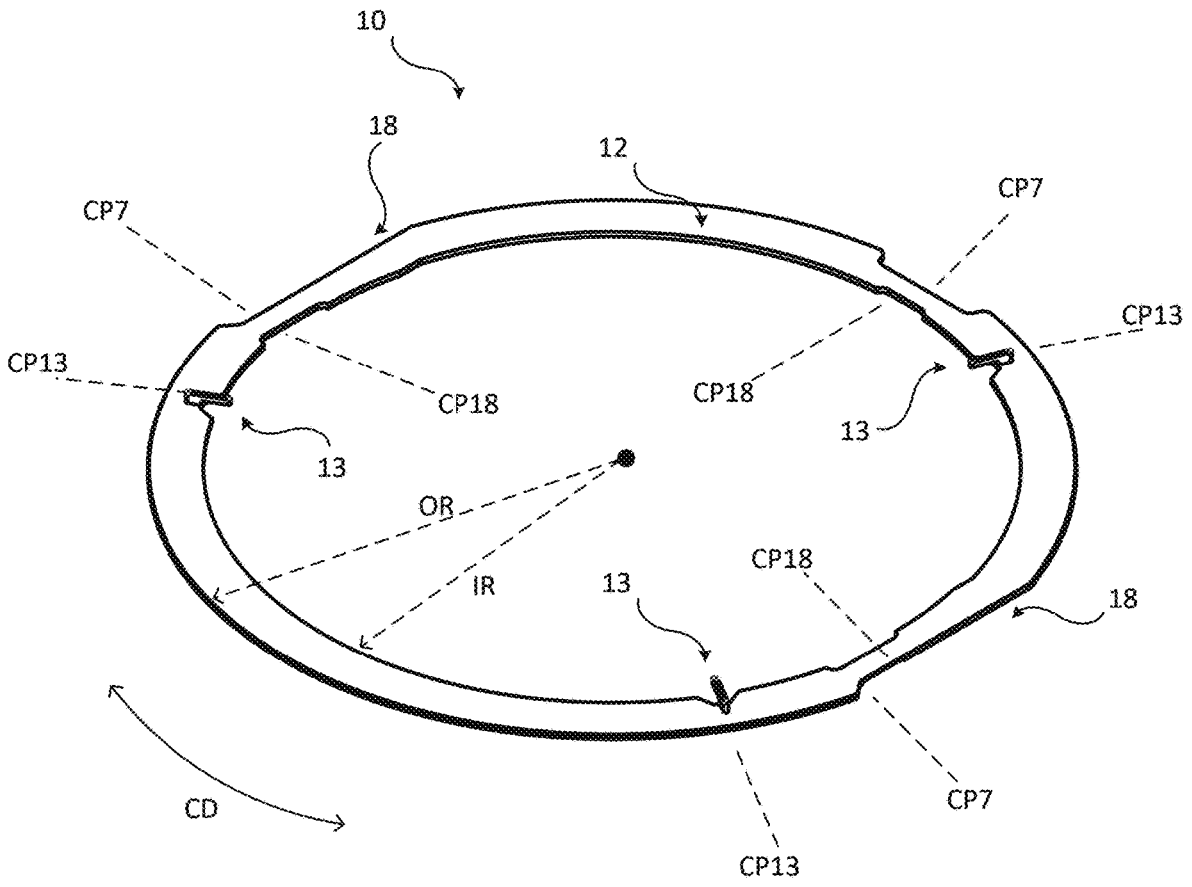
FIG. 7a shows a perspective view of a holder ring according to embodiments of the present invention.
Figures 7B, 8:
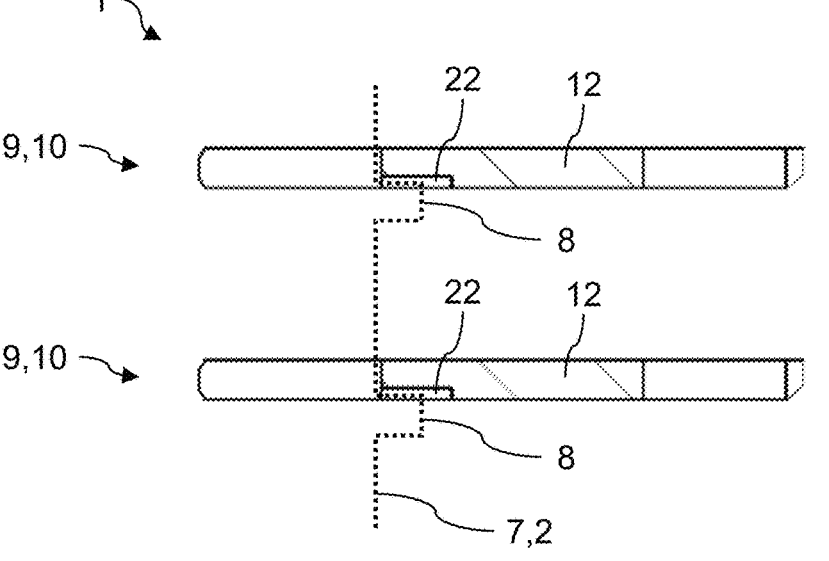
FIG. 7b shows a bottom view of the holder ring of FIG. 1.
FIG. 8 shows a cross-sectional side view of parts of the holder ring of FIG. 1 and a further similar holder ring, with part of the carrier of FIG. 2.
Figure 12:
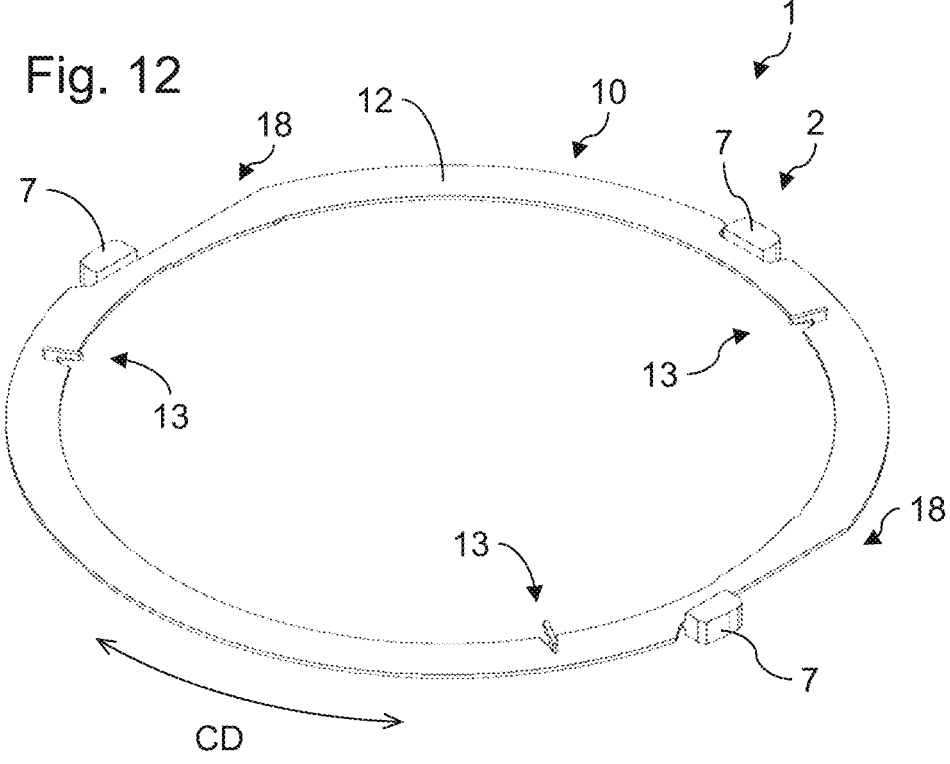
FIG. 12 shows a perspective view of a possible variant of the holder ring with parts of a carrier.
Figure 13:
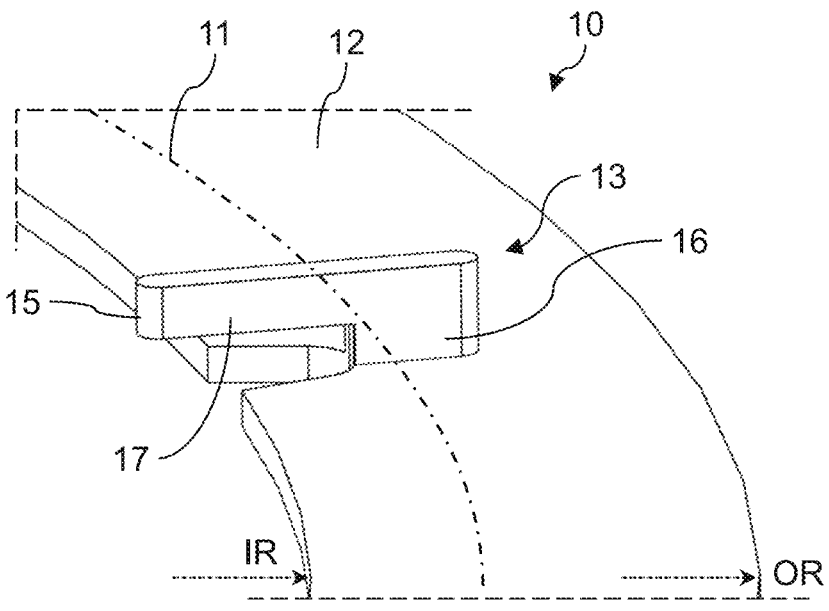
FIG. 13 shows a perspective view of a ring projection and an associated section of the holder ring of FIG. 12, with part of a wafer.

In this way, a robust and reliable engagement between the annular body 12 and the axial rods 7 can be provided, in particular with reliable circumferential positioning of the ring projections 13 with respect to the axial rods 7. Rod positions CP7 have been indicated in FIGS. 1 and 3, while FIG. 12 shows parts of axial rods 7 at corresponding positions for a variant of the holder ring 10. At the rod positions CP7, respective recesses 22 may be provided in a bottom surface of the annular body 12, e.g. as shown in FIGS. 7*a* and 7*b* and 8, to further promote robust and reliable engagement between the annular body 12 and the axial rods 7, in particular the rod projections 8 thereof.

In embodiments, the variation of the outer radius OR additionally provides passages 18 for at least some of the axial rods 7 when the annular body 12 moves into the carrier 2 to allow the axial rods 7 to be at the determined positions.

Thereby, the axial rods 7 can be relatively well distributed in the circumferential direction CD for robust support of the holder rings 10, while the holder rings 10 can still be moved into and out of the carrier 2, in particular between the axial rods 7 for which the passages 18 are provided.

In embodiments, the annular body 12 has an inner radius IR that varies along its circumferential direction CD, wherein, at the passages 18 for the at least some of the axial rods 7, the inner radius IR is small compared to a circumferential average or median of the inner radius IR of the annular body 12.

In this way, a possible deposition effect of the passages 18 may be at least partly compensated. It has been found that such a reduction of the inner radius IR may be relatively small, e.g. as seen in FIG. 5, while still being effective. The reduction of the inner radius preferably does not circumferentially overlap with the axial rod 7 when positioned at its end position CP7, so as to prevent accumulation of effects of the axial rod 7 and the reduced inner radius. Meanwhile, the reduction of the inner radius IR preferably extends along a circumferential section 23 corresponding to the respective passage 18, as may be seen in FIG. 5. It shall be appreciated that, at least in this respect, the passage 18 extends up to, but does not include, the space occupied by the axial rod 7 when positioned at its end position CP7.

In embodiments, referring to FIG. 7*a*, the annular body 12 has an inner radius IR which varies along its circumferential direction CD, wherein, at a circumferential position CP18 at least partially overlapping with end positions CP7 for the at least some of the axial rods 7, the inner radius IR is large compared to a circumferential average or median of the inner radius IR of the annular body 12.

In this way, a possible deposition effect of the axial rods 7 may be at least partly compensated. The increase of the inner radius IR preferably circumferentially overlaps with the axial rod 7 when positioned at its end position CP7.

Figures 9, 10, 11:
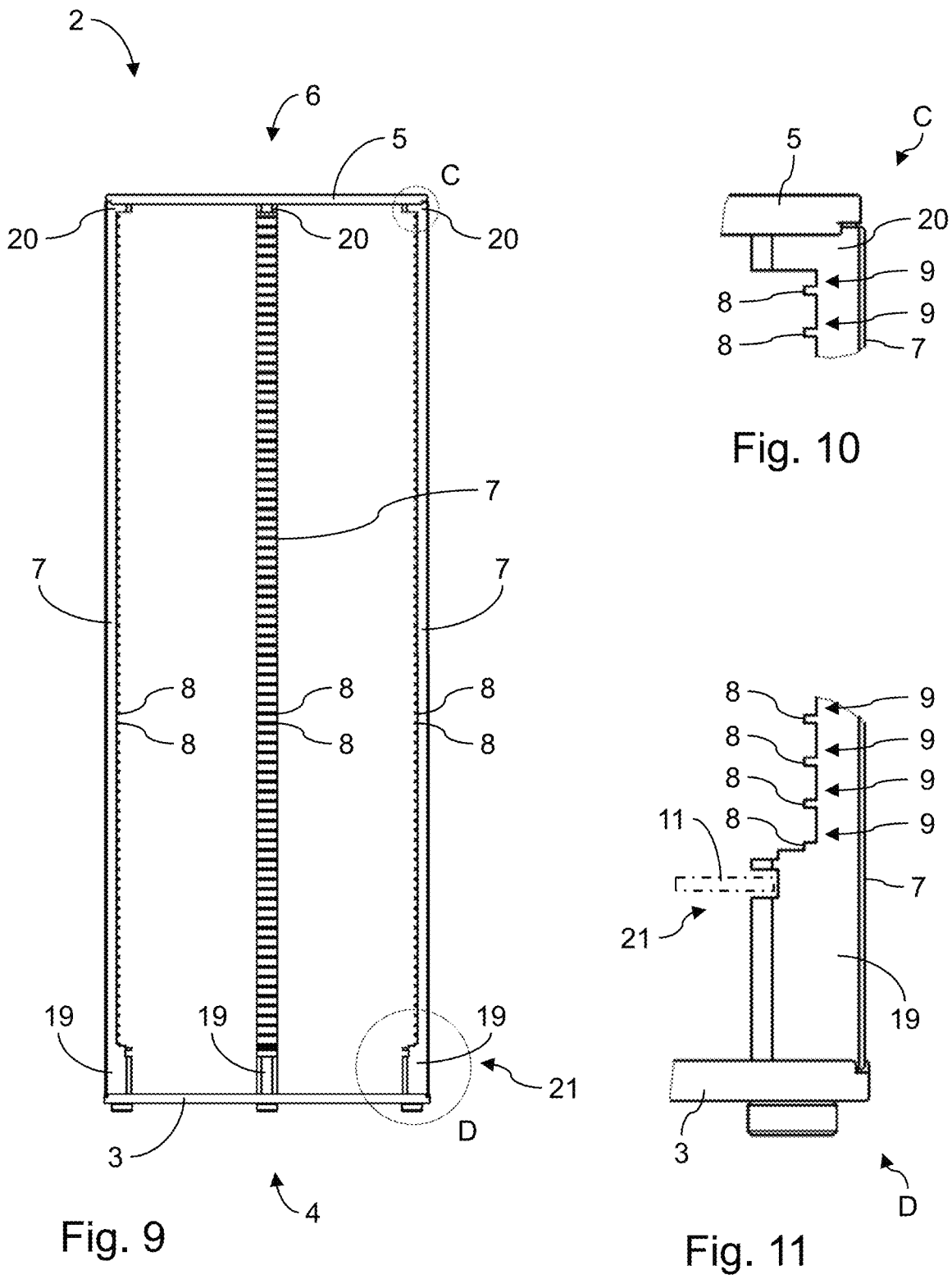
FIG. 9 shows a side view of the carrier of FIG. 2.
FIG. 10 shows a detail C from FIG. 9.
FIG. 11 shows a detail D from FIG. 9.

In embodiments, with particular reference to FIGS. 9-11, adjacent at least one of the first end member 3 and the second end member 5, respective first and/or second end sections 19, 20 of the axial rods 7 are dimensioned to extend radially inwardly into the carrier 2 beyond the rod projections 8 to thereby provide a reference structure 21 for a robot for use in automated positioning of wafers 11 in the carrier 2 by the end effector. In embodiments, the reference structure 21 defines transversal components of target wafer positions in the carrier 2. In embodiments, the reference structure 21 is dimensioned to receive a wafer 11 therein without any holder ring.

Such a reference structure 21 can advantageously enable a wafer positioning robot comprising an end effector to learn the proper transversal position for wafers in the carrier 2, in particular by iteratively causing a wafer or dummy wafer to fully engage with the reference structure 21 while sensing or otherwise determining the full engagement and registering the corresponding position of the end effector. When subsequently positioning wafers into the carrier 2, the learned transversal wafer position can be applied to precisely position wafers 11 onto holder rings 10 in a substantially feed forward manner, at least without requiring sensing of a wafer's transversal position in the carrier 2 for each wafer in turn. In this sense, the reference structure 21 may be regarded as a calibration structure, and/or the associated procedure as described above may be regarded as a calibration procedure of such a wafer positioning robot.

A holder ring 10 and/or a wafer boat system 1 as described herein may be used for processing wafers 11, wherein during the processing the wafers 11 are in contact with the ring projections 13 of the holder ring 10 that supports the respective wafer 11, preferably wherein the wafers 11 are not in direct contact with the carrier 2. In embodiments, the processing involves vapor deposition, in particular using a silicone-based compound such as $Si_3H_8$.

Figure 15:
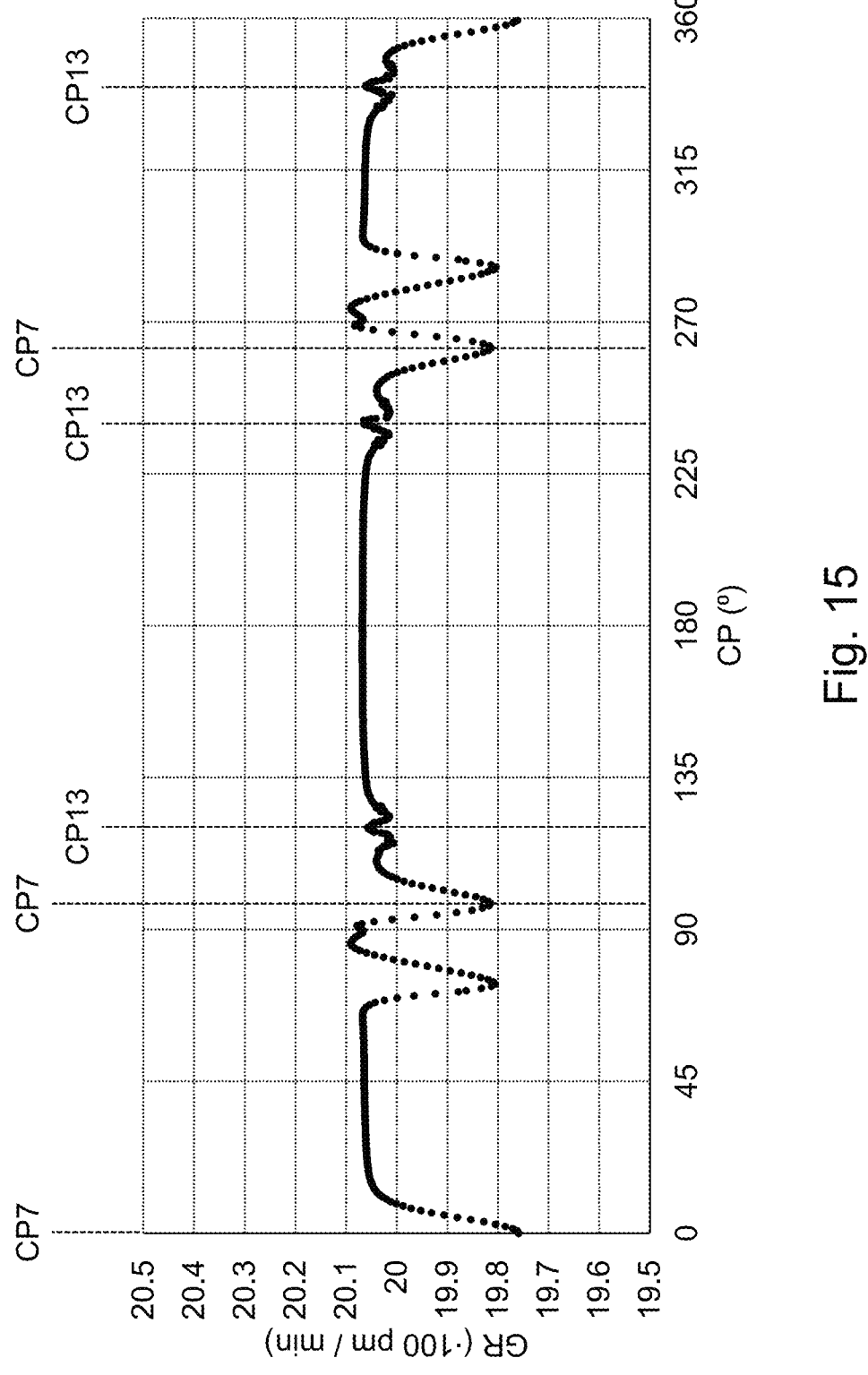
FIG. 15 shows a graph representing a simulation result associated with the wafer boat system of FIGS. 1-11.

FIG. 15 shows a graph representing a simulation result based on a computer model of the wafer boat system 1 shown in FIGS. 1-11, i.e. with the holder ring 10 as shown in FIGS. 1 and 3-8. In the graph of FIG. 15, the horizontal axis represents the circumferential position CP in degrees, wherein a value of zero degrees here corresponds to position CP7 seen at the top of FIG. 3, and values increase counterclockwise in the view of FIG. 3. Positions CP7 of the rods 7 and positions CP13 of the ring projections 13 have been indicated as vertical dashed lines in FIG. 15. Meanwhile, the vertical axis represents a growth rate GR in factors of 100 pm (i.e. 1 angstrom) per minute. Data points shown in the graph FIG. 15 thus represent a growth rate at a particular circumferential position.

The growth rate data shown in FIG. 15 were simulated for the indicated circumferential positions at radial positions 2 mm inward from the outer edge of a top side of a supported wafer, based on a simulated vapor deposition using $Si_3H_8$ as a silicone-based compound. The values of the resulting growth rates range between 19.76 to 20.09, i.e. a range of 0.33, whereas the circumferential average of the growth rate GR is 20.0. Based on this, the remaining non-uniformity at the edge of the wafer can be said to be as low as (0.33/20.0=) 1.65%. By contrast, for a known wafer boat system, the value of the same non-uniformity metric was found to be as high as 7.5% in a corresponding simulation, showing that a design according to the present invention can provide a substantial improvement in uniformity. In particular, it can be seen in FIG. 15 that the range of growth rate values around the circumferential positions CP13 of the ring projections is very small, thanks to the effect of the ring projections 13 being at least partly compensated by the locally reduced surface area and/or inner radius IR of the annular body 12.

Although the invention has been explained herein using examples of embodiments and drawings, these do not limit the scope of the invention as determined by the claims. Within said scope, many variations, combinations and extensions are possible, as will be appreciated by the skilled person having the benefit of the present disclosure. For example, the number of axial rods of a carrier, and/or the number of ring projections of a holder ring, may be larger than three. All such variants are included in the scope of the invention as defined by the claims.

LIST OF REFERENCE SIGNS

1. Wafer boat system
2. Carrier
3. First end member
4. First axial end of carrier
5. Second end member
6. Second axial end of carrier
7. Axial rod
8. Rod projection
9. Holder ring position
10. Holder ring
11. Wafer
12. Annular body
13. Ring projection
14. Circumferential section adjacent ring projection
15. Distal end of ring projection
16. Proximal section of ring projection
17. Distal section of ring projection
18. Passage for axial rod
19. First end section of axial rod
20. Second end section of axial rod
21. Reference structure
22. Recess in annular body for rod projection
23. Circumferential section with reduced inner radius
CD. Circumferential direction
CP. Circumferential position
CP7 Rod position along circumferential direction
CP13. Circumferential position of ring projection
CW. Circumferential window
GR. Growth rate IR. Inner radius of annular body
OR. Outer radius of annular body

The invention claimed is:

1. A wafer boat system comprising:
a carrier; and
a plurality of holder rings,
wherein the carrier comprises a first end member at a first axial end of the carrier, a second end member at a second axial end of the carrier, and at least three mutually spaced apart axial rods;
wherein each axial rod of the at least three mutually spaced apart axial rods connects the first end member with the second end member and comprises a series of rod projections extending inwardly and defining axially spaced apart holder ring positions;
wherein each rod projection of the series of rod projections, of each of the at least three mutually spaced apart axial rods, is configured to support one of the plurality of holder rings in the carrier at one of the holder ring positions;
wherein each holder ring of the plurality of holder rings is configured to support a wafer in the carrier;
wherein each holder ring of the plurality of holder rings has an annular body and ring projections projecting from the annular body, the ring projections being arranged to be in contact with the wafer and to space the wafer apart from the annular body when the wafer is supported by the holder ring in the carrier; and
wherein the annular body has a local surface area that varies along its circumferential periphery, wherein, at the ring projections, the local surface area of the annular body is smaller than a circumferential average or median of the local surface area of the annular body.

2. The wafer boat system according to claim 1, wherein the local surface area is defined based on a circumferential portion of 30 degrees or smaller along the circumferential periphery of the annular body.

3. The wafer boat system according to claim 1, wherein the annular body has an inner radius that varies along its circumferential periphery,
wherein, at the ring projections, the inner radius is larger than a circumferential average or median of the inner radius of the annular body.

4. The wafer boat system according to claim 3, wherein, at the ring projections of each holder ring of the plurality of holder rings, the inner radius of the annular body is at least 1% larger than the circumferential average or median of the inner radius of the annular body.

5. The wafer boat system according to claim 3, wherein, along a circumferential section of the annular body adjacent each ring projection of each holder ring of the plurality of holder rings, the inner radius of the annular body increases towards a circumferential position of the ring projection.

6. The wafer boat system according to claim 3, wherein the ring projections of the at least three mutually spaced apart axial rods extend from the annular body, of each holder ring of the plurality of holder rings, radially inwardly beyond the inner radius of the annular body.

7. The wafer boat system according to claim 1, wherein a distal end of each ring projection of the at least three mutually spaced apart axial rods is both radially inwardly and axially spaced apart from an annular body of a first holder ring of the plurality of holder rings, and wherein the distal end is configured to be in contact with the annular body when the wafer is supported by the first holder ring.

8. The wafer boat system according to claim 7, wherein a proximal section of each ring projection of the at least three mutually spaced apart axial rods projects axially from the annular body of the first holder ring, and wherein a distal section of the ring projection extends radially inwardly from the proximal section of the ring projection at a distance from the annular body.

9. The wafer boat system according to claim 7, wherein a proximal section of each ring projection of the at least three mutually spaced apart axial rods projects radially inwardly from the annular body of the first holder ring, and wherein a distal section of the ring projection extends axially from the proximal section of the ring projection at a distance from the annular body.

10. The wafer boat system according to claim 1, wherein the ring projections of each holder ring of the plurality of holder rings, are circumferentially spaced apart from the at least three mutually spaced apart axial rods.

11. The wafer boat system according to claim 1, wherein the annular body, of each holder ring of the plurality of holder rings, has an outer radius that varies along its circumferential periphery, and wherein variation of the outer radius determines respective rod positions for the at least three mutually spaced apart axial rods along the circumferential periphery of the annular body.

12. The wafer boat system according to claim 11, wherein the annular body, of each holder ring of the plurality of holder rings, has an inner radius that varies along its circumferential periphery, wherein, at passages for at least some of the at least three mutually spaced apart axial rods, the inner radius is smaller than a circumferential average or median of the inner radius of the annular body.

13. The wafer boat system according to claim 11, wherein the annular body, of each holder ring of the plurality of holder rings, has an inner radius that varies along its circumferential periphery, wherein, at circumferential positions at least partially overlapping with end positions for at least some of the at least three mutually spaced apart axial rods, the inner radius is larger than a circumferential average or median of the inner radius of the annular body.

14. The wafer boat system according to claim 1, wherein, during processing of the wafer, the wafer is not in direct contact with the carrier.

15. The wafer boat system according to claim 1, wherein, during processing of the wafer involving vapor deposition using a silicone-based compound, the wafer is not in direct contact with the carrier.

16. A wafer boat system comprising:
a carrier; and
a plurality of holder rings;
wherein the carrier comprises a first end member at a first axial end of the carrier a second end member at a second axial end of the carrier and at least three mutually spaced apart axial rods;
wherein each axial rod of the at least three mutually spaced apart axial rods connects the first end member with the second end member and each comprises a series of rod projections extending inwardly and defining axially spaced apart holder ring positions;
wherein each rod projection of the series of rod projections, of each of the at least three mutually spaced apart axial rods, is configured to support one of the plurality of holder rings in the carrier at one of the holder ring positions;
wherein each holder ring of the plurality of holder rings is configured to support a wafer in the carrier;
wherein each holder ring of the plurality of holder rings has an annular body and ring projections projecting from the annular body, the ring projections being arranged to be in contact with the wafer and to space the wafer apart from the annular body when the wafer is supported by the holder ring in the carrier; and
wherein the annular body has an inner radius that varies along its circumferential periphery, and, at the ring projections, the inner radius is larger than a circumferential average or median of the inner radius of the annular body.

* * * * *